US011652457B2

(12) United States Patent
Petenyi

(10) Patent No.: US 11,652,457 B2
(45) Date of Patent: May 16, 2023

(54) CIRCUIT EMPLOYING MOSFETS AND CORRESPONDING METHOD

(71) Applicant: STMicroelectronics Design and Application S.R.O., Prague (CZ)

(72) Inventor: Sandor Petenyi, Lysa nad Labem (CZ)

(73) Assignee: STMicroelectronics Design and Application S.R.O., Prague (CZ)

( * ) Notice: Subject to any disclaimer, the term of this patent is extended or adjusted under 35 U.S.C. 154(b) by 38 days.

(21) Appl. No.: 17/362,276

(22) Filed: Jun. 29, 2021

(65) Prior Publication Data

US 2021/0328563 A1     Oct. 21, 2021

Related U.S. Application Data

(63) Continuation of application No. 16/786,182, filed on Feb. 10, 2020, now Pat. No. 11,082,018.

(30) Foreign Application Priority Data

Feb. 11, 2019     (IT) .................. 102019000001941

(51) Int. Cl.
    *H03F 3/45*     (2006.01)
    *H03F 1/02*     (2006.01)
    *H03F 1/30*     (2006.01)
(52) U.S. Cl.
    CPC ....... *H03F 3/45179* (2013.01); *H03F 1/0205* (2013.01); *H03F 1/301* (2013.01); *H03F 2200/78* (2013.01); *H03F 2203/45* (2013.01)
(58) Field of Classification Search
    CPC .................................................. H03F 3/45179
    See application file for complete search history.

(56) References Cited

U.S. PATENT DOCUMENTS

| 6,211,659 | B1* | 4/2001 | Singh ...................... G05F 3/262 |
| | | | 323/315 |
| 7,893,766 | B1 | 2/2011 | Cranford, Jr. et al. |
| 8,674,767 | B2 | 3/2014 | Chen et al. |
| 9,112,484 | B1* | 8/2015 | Clark ................. G01R 31/2884 |
| 9,654,092 | B1 | 5/2017 | Schaffer et al. |

(Continued)

FOREIGN PATENT DOCUMENTS

EP     2028761 A1     2/2009

OTHER PUBLICATIONS

IT Search Report and Written Opinion for IT Appl. No. 102019000001941 dated Oct. 9, 2019 (8 pages).

*Primary Examiner* — Patricia T Nguyen
(74) *Attorney, Agent, or Firm* — Crowe & Dunlevy

(57) ABSTRACT

A MOSFET has a current conduction path between source and drain terminals. A gate terminal of the MOSFET receives an input signal to facilitate current conduction in the current conduction path as a result of a gate-to-source voltage reaching a threshold voltage. A body terminal of the MOSFET is coupled to body voltage control circuitry that is sensitive to the voltage at the gate terminal of the MOSFET. The body voltage control circuitry responds to a reduction in the voltage at the gate terminal of the MOSFET by increasing the body voltage of the MOSFET at the body terminal of the MOSFET. As a result, there is reduction in the threshold voltage. The circuit configuration is applicable to amplifier circuits, comparator circuits and current mirror circuits.

8 Claims, 3 Drawing Sheets

(56) References Cited

U.S. PATENT DOCUMENTS

| | | | |
|---|---|---|---|
| 10,355,694 B1* | 7/2019 | Kumar | H03K 19/20 |
| 10,469,097 B1 | 11/2019 | Bothra | |
| 2005/0275461 A1* | 12/2005 | Heightley | H03F 3/45183 |
| | | | 330/261 |
| 2005/0280437 A1* | 12/2005 | Lewis | H03K 19/00369 |
| | | | 326/38 |
| 2008/0277731 A1* | 11/2008 | Edwards | H01L 29/78 |
| | | | 257/E21.409 |
| 2009/0251213 A1* | 10/2009 | Mangudi | G05F 3/205 |
| | | | 330/253 |
| 2010/0264896 A1 | 10/2010 | Tonomura | |
| 2011/0001561 A1 | 1/2011 | Ouchi | |
| 2012/0200283 A1* | 8/2012 | Socheat | G05F 1/575 |
| | | | 323/311 |
| 2016/0013763 A1 | 1/2016 | Tomimatsu et al. | |
| 2016/0276982 A1* | 9/2016 | Kang | H03F 3/193 |

* cited by examiner

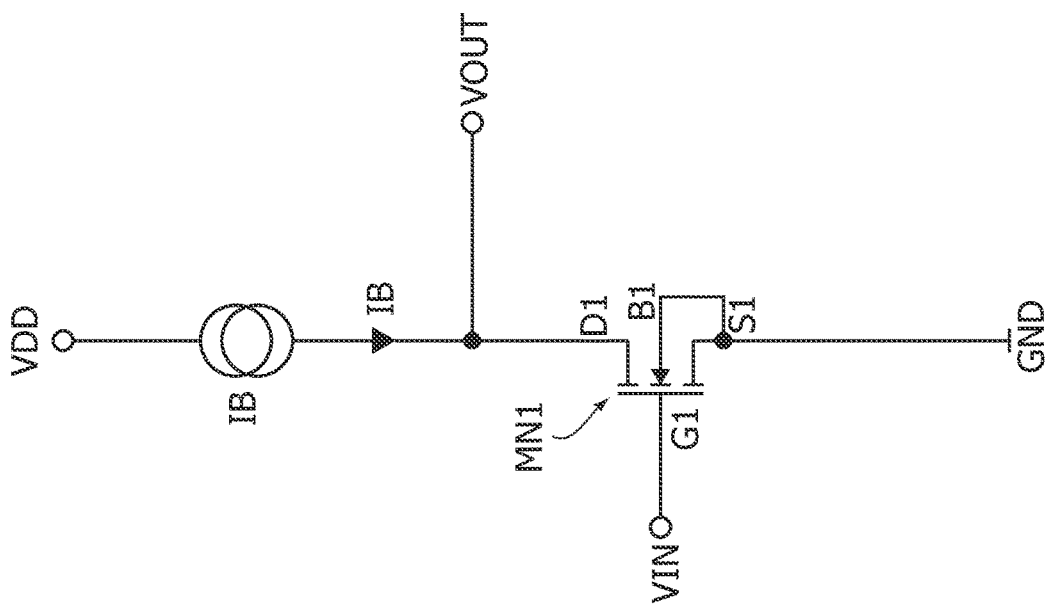

CIRCUIT EMPLOYING MOSFETS AND CORRESPONDING METHOD

CROSS REFERENCE TO RELATED APPLICATION

This application is a continuation of U.S. patent application Ser. No. 16/786,182, filed Feb. 10, 2020, which claims the priority benefit of Italian Application for Patent No. 102019000001941, filed on Feb. 11, 2019, the content of which are hereby incorporated by reference in their entireties to the maximum extent allowable by law.

TECHNICAL FIELD

The invention relates to the field of electronic circuits using MOSFETs.

Amplifiers such as differential amplifiers, comparators and current mirrors employing MOSFETs are exemplary of circuits where one or more embodiments may be applied.

BACKGROUND

MOSFET (an acronym for metal-oxide-semiconductor field-effect transistor) devices are commonly used in electronic circuits. In comparison with their bipolar counterparts, MOSFETs (which are also referred to with various alternative designations such as MOS-FETs, MOS FETs, MOS transistors or MOSFET transistors) may offer improved performance, for instance due to their isolated control port and output ports.

As is the case for any "real" component, various electrical characteristics and parameters of a MOSFET must be taken into account.

For instance, a significant parameter is the input threshold voltage (VTH): achieving a sufficient drain current (ID) usually involves applying a gate-to-source (VGS) voltage higher than VTH. Below VTH, a MOSFET conducts a (very) low ID current which can be insufficient for maintaining a correct operating point of a MOSFET working, for example, in amplifier stage.

Input voltage (VIN) range is a significant parameter in an amplifier. If the input signal is out of this range, the amplifier may not be able to process it adequately. In various cases a wide VIN range is desirable.

Various existing solutions involve specific circuit arrangements where an amplifier circuit is accommodated for an expected VIN range by selecting proper types of MOSFET (n-channel or p-channel). For instance, rail-to-rail input stages have been proposed which are based on both MOSFET types.

Various existing solutions involve special MOSFET types (such as, natural, depletion, etc.), which may be critical in terms of availability.

It is observed that in certain cases the circuit-based approach is unable to provide a satisfactory solution and/or the technology is unable to provide special MOSFET types as desirable.

As an example, one may consider a MOSFET-based amplifier for which VTH=0.7V, with the amplifier expected to be supplied at a supply voltage VDD=1.0V and driven by an input signal VIN=0.5V. In this exemplary case, neither n-channel, nor p-channel MOSFETs can provide adequate processing of a VIN level as indicated.

Despite the extensive activity in the area, further improved solutions are desirable.

There is a need in the art to provide an improved solution addressing the various points discussed in the foregoing.

SUMMARY

Embodiments herein concern a circuit and a corresponding method.

One or more embodiments may provide a MOSFET amplifier circuit with increased input voltage range.

One or more embodiments may involve the recognition that a limitation for input voltage range of an amplifier may be related to the threshold voltage of an input MOSFET device: below the threshold voltage, the drain current flowing may be insufficient, so that an operating point cannot be properly set.

One or more embodiments may rely on the body effect applied on an input MOSFET for lowering its threshold voltage, with such a body effect adapted to be applied by a control circuit (only) when necessary.

In one or more embodiments, in the presence of an input voltage sufficient for operation without body effect, the MOSFET body may not be polarized and the amplifier may operate as a conventional amplifier.

In one or more embodiments, a body-source voltage can be applied leading to a reduction in the threshold voltage which facilitates normal operation.

One or more embodiments are suited to be embedded in an existing amplifier layout which may benefit from an extended input voltage range without affecting the main components in the signal path.

One or more embodiments lend themselves to being implemented without resorting to special components such as natural MOSFETs or depletion MOSFETs.

For instance, one or more embodiments lend themselves to be implemented with any known CMOS technology where MOSFET transistors can be produced with an accessible body terminal.

One or more embodiments can thus lead to simple solutions, involving few components, with negligible current consumption.

One or more embodiments may widen the VIN range of MOSFET-based amplifier circuits.

One or more embodiments may involve changing the MOSFET body terminal polarization according to the VIN level.

For instance, in the case of an amplifier circuit based on n-channel MOSFETs:
  if the VIN level is (well) above VTH, the body is shorted to the source and no body polarization is applied;
  if the VIN level drops below VTH, the MOSFET body polarized positively with respect the source; this results in a decrease of VTH, thus facilitating normal operation of the MOSFET.

One or more embodiments may be applied in MOSFET amplifier circuits, such as in MOSFET-based differential amplifier circuits and other circuits such as comparators and current mirrors.

BRIEF DESCRIPTION OF THE DRAWINGS

One or more embodiments will now be described, by way of example only, with reference to the annexed figures, wherein:

FIG. 1 is a circuit diagram of a MOSFET amplifier stage;

FIG. 2 is a circuit diagram of a MOSFET-based differential stage;

DETAILED DESCRIPTION

Figure 4:
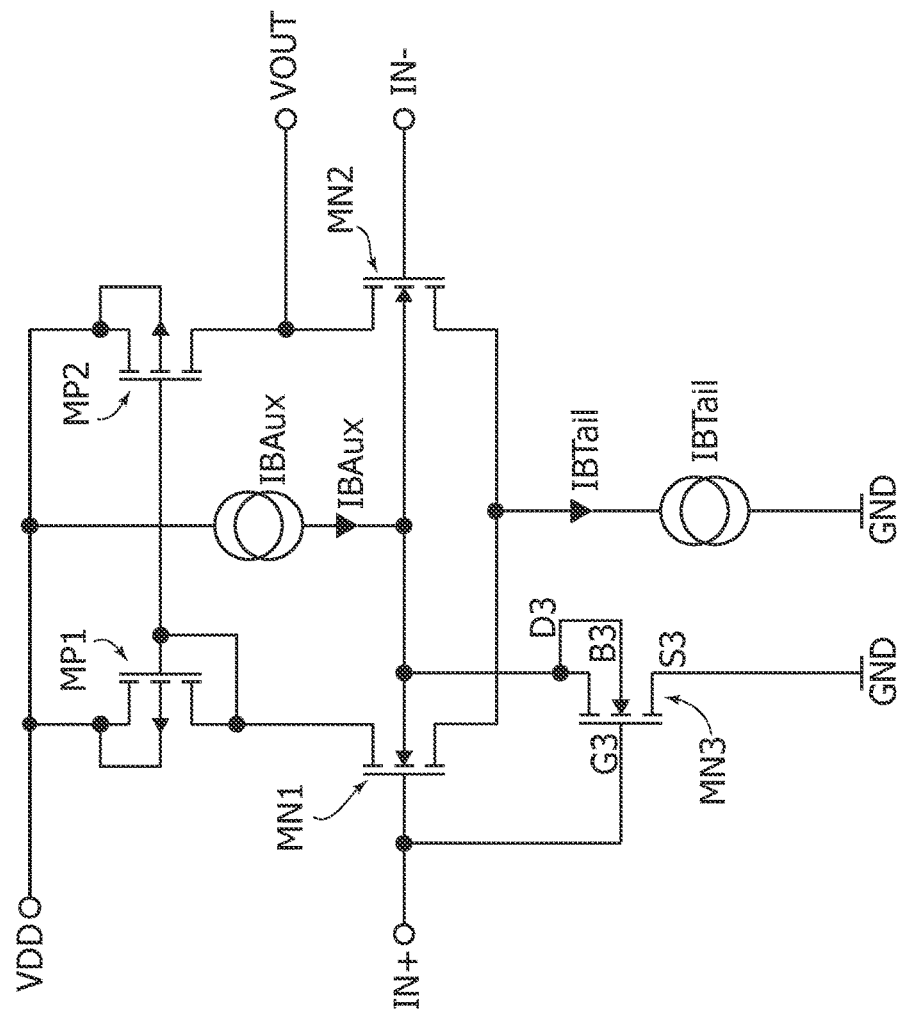
FIG. 4 is a second circuit diagram exemplary of embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is configured to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

By way of background to the presentation of examples of embodiments, one may refer to FIGS. 1 and 2.

FIG. 1 is an elementary circuit diagram of a MOSFET-based amplifier stage, including a MOSFET transistor (hereinafter, briefly "MOSFET") MN1 working in a common source configuration having a drain biased by a current generator IB coupled to a supply node at a voltage VDD and a source coupled to ground GND.

In FIG. 1:
the symbol G1 is indicative of the gate (control) electrode or terminal of the MOSFET coupled to an input node at which an input voltage VIN is received;
the symbols S1 and D1 are indicative, respectively, of the source and drain electrodes or terminals of the MOSFET(s) having extending therebetween a current path (channel) coupled—at the drain, in the exemplary case represented here) to an output node at which an output voltage VOUT is received; and
the symbol B1 is indicative of the body electrode or terminal of the MOSFET which, as indicated, will be assumed to be accessible.

The same symbols G, S, D, B introduced previously will be adopted throughout this description to denote, respectively, the gate, source, drain and body terminals of the various MOSFETS discussed with suffixes 1, 2, 3, . . . identifying the respective MOSFET.

The simple one-transistor amplifier stage (working in a common source configuration loaded by a current generator IB generating an identically-named current) exemplified FIG. 1 can amplify the input signal VIN (only) if the level of VIN is above the threshold voltage VTH of the MOSFET transistor MN1 so that the drain current ID is comparable with the current provided by bias generator IB.

If the input signal level is below VTH, the drain current is not sufficient and the MOSFET transistor MN1 is not able to "pull down" the drain node. This means that the output node VOUT stays in a high saturation condition and does not reflect the input signal VIN as desired.

The same also applies mutatis mutandis to a MOSFET-based differential stage supplied by VDD and GND rails as exemplified in FIG. 2, which includes two MOSFET transistors MN1, MN2 having:
their body terminals B1, B2 (jointly) coupled to ground GND,
their source terminals S1, S2 (jointly) coupled to a tail current generator IBTail referenced to ground GND,
their drain terminals D1, D2 coupled to the supply node VDD via respective current paths through two further MOSFET transistors MP1, MP2 having their gates mutually coupled.

As exemplified herein MOSFETs MP1 and MP2 are configured as a current mirror, with:
MOSFET MP1, having shorted drain and gate terminals, which acts as feeding input of the mirror, and
MOSFET MP2, having the same gate-to-source voltage as MP1, which acts as output, mirroring the drain current of MN1.

This solution facilitates transforming differential drain currents into a single-ended output voltage (VOUT).

It will be appreciated that, as exemplified herein, the transistors MP1, MP2 are of a complementary type, p-channel when MN1 and MN2 are n-channel, for instance.

For that reason the MOSFET designations used herein may adopt names with N and P to distinguish n-channel and p-channel MOSFET types.

In an embodiment as exemplified in FIG. 2:
the input signal VIN is applied "differentially" (as IN+ and IN−, for instance) between the gates G1, G2 of MN1 and MN2,
the output signal VOUT is collected at an identically-named node between MP2 and the drain D2 of MN2,
the transistors MP1, MP2 have their body terminals B1, B2 shorted to their current paths (towards VDD) at the respective source terminals thereof,
MP1 has also its gate shorted to its current path (towards MN1) at the respective drain terminal.

As exemplified herein, MP1 and MP2 form a current mirror, which mirrors current from the drain of MP1 to the drain of MP2. The drain current of MP2 is compared with the current of MN2 at the VOUT node, with the result of comparison being the VOUT potential. The node VOUT can thus be regarded as a voltage gain node.

Again, correct operation of such a differential amplifier stage is facilitated by input voltages applied at IN+, IN− being higher than the threshold voltages VTH of the MOSFETs MN1, MN2 plus some (minimum) voltage associated with the tail current generator IBTail.

For instance, the tail current IBTail can be provided by a current mirror with 50 mV to 100 mV (minimum) to provide a stable IBTail current. If the input voltages at IN+, IN− are below the minimum voltage, the IBTail current generator is unable to provide a stable current and performance of the differential stage is degraded with complete malfunction eventually revealed.

One or more embodiments that address the issues discussed in the foregoing are exemplified in FIGS. 3 to 6.

Figure 3:
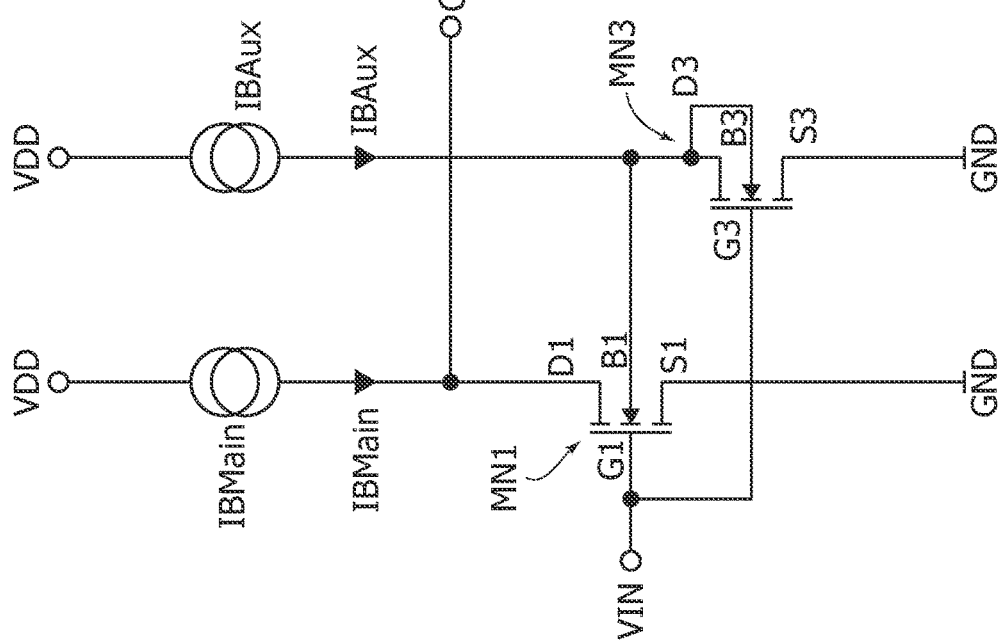
FIG. 3 is a first circuit diagram exemplary of embodiments.

FIGS. 3 and 4 are exemplary of arrangements where the circuits of FIGS. 1 and 2 are supplemented with a further MOSFET transistor MN3 and an (auxiliary) bias generator IBAux with a body control sensing capability of the voltage at the input node VIN (FIG. 3) or at the non-inverting input node IN+ of the differential stage (FIG. 4).

Such a body control sensing capability is configured to reduce (lower) the threshold VTH when the input voltages, VIN or IN+, IN− drop near or below the threshold VTH.

Figure 5:
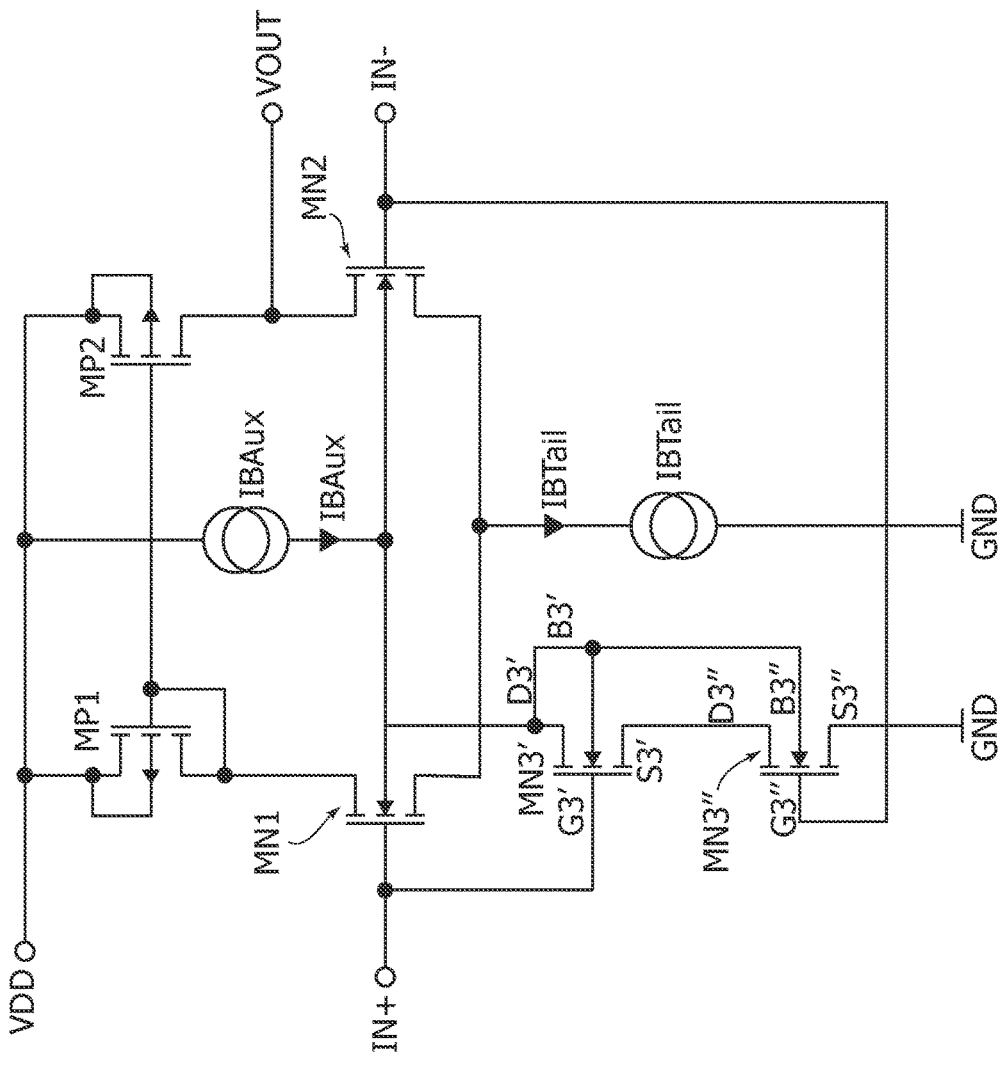
FIG. 5 is a third circuit diagram exemplary of embodiments.

FIG. 5 is exemplary of a possible development of the differential stage of FIG. 4 which includes two further MOSFET transistor MN3', MN3" (in the place of one) where the body control capability is configured to sense the voltages at both inputs IN+ and IN− and accommodates (adjusts) the body voltage according to the lower one.

Figure 6:
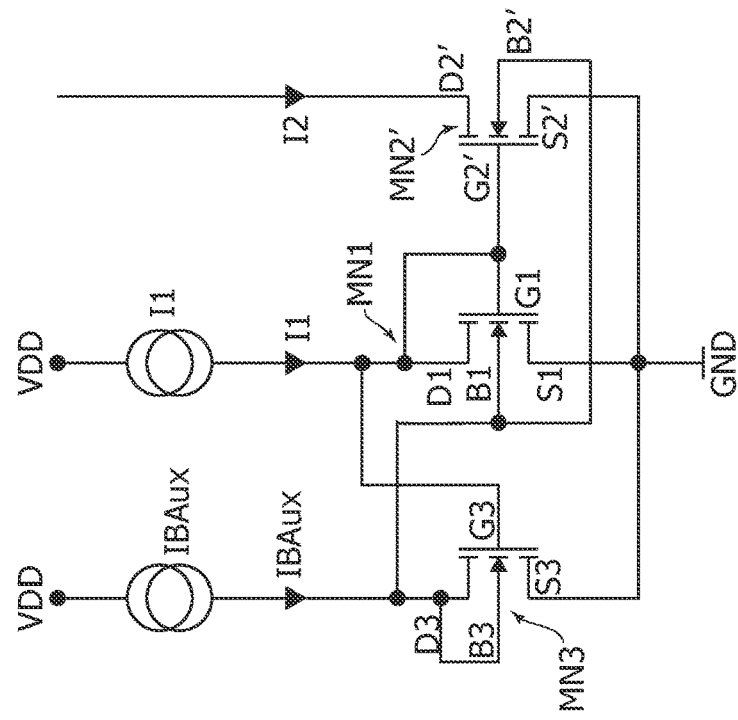
FIG. 6 is a fourth circuit diagram exemplary of embodiments.

FIG. 6 is exemplary of embodiments applied in a current mirror arrangement.

Throughout the figures like elements are indicated with like references/symbols thus making it unnecessary to repeat a detailed description for each figure. For instance, as already indicated, the same symbols G, S, D, B will be adopted throughout this description to denote the gate, source, drain and body terminals of the various MOSFETS discussed with suffixes 1, 2, 3, . . . identifying the respective MOSFET.

Also, for simplicity:
specific references for the gate, source, drain and body terminals of the certain MOSFETS will not be unnecessarily repeated in certain figures,
a same designation may be used for a certain circuit node/terminal and a signal applied/sensed/collected at that node/terminal.

One or more embodiments may rely on the recognition that the threshold voltage VTH of the input transistor can be reduced if a lowest (minimum) input signal level is not sufficient for a particular application.

For instance, in an embodiment as exemplified in FIG. 3 the input signal at the input node VIN is sensed by two circuit elements: in addition to the "amplifying" MOSFET MN1 loaded by the current source IBMain, the input signal VIN is sensed (again at the gate terminal G3) by the MOSFET MN3 loaded by a current source IBAux.

The MOSFET MN3 has its body terminal B3 shorted to its drain terminal D3 and to the body terminal B1 of MN1.

In one or more embodiments, the two MOSFETs MN1 and MN3 may be of the same type so their electrical characteristics are matched, even with different W/L (width/length) sizing applied.

If the input voltage is higher than the threshold voltage VTH of both MOSFETs MN1 and MN3, the body of both these transistors (namely B1 and B3) is tied to GND by MN3.

In the case of MN3, as a result of input voltage VIN dropping near the threshold voltage VTH, the drain current through MN3 will not be sufficient for sinking all the current provided by IBAux and the drain potential of MN3 will start to increase. Because this (drain) node D3 is connected to the bodies (bulks) B1 and B3 of both MOSFETs MN1 and MN3, the potential of these bulk nodes will start to increase.

Due to a resulting body effect the threshold voltage VTH for both the MOSFETs MN1, MN3 will decrease.

As noted, good practice may suggest to size the MOSFETs MN1 and MN3 differently, for instance with the W/L (width/length) ratio of MN1 higher than the W/L ratio for MN3. This will facilitate and early detection of a low input level and application of a body effect as discussed.

The effect of body polarization can be described by the following equation:

$$V_{TB} = V_{T0} + \frac{\sqrt{2 \cdot \varepsilon_S \cdot q \cdot N_a}}{C_{OX}} (\sqrt{V_{SB} + 2 \cdot \Phi_F} - \sqrt{2 \cdot \Phi_F})$$

Where:
$V_{TB}$ is the threshold with body effect
$V_{T0}$ is the threshold with body and source shorted $$\frac{\sqrt{2 \cdot \varepsilon_S \cdot q \cdot N_a}}{C_{OX}}$$

is a constant
$V_{SB}$ is source-to-body voltage
$\Phi_F$ is a potential

The equation reported above proves that applying a positive voltage between the source S and the body B of a MOSFET increases the threshold value VTH, while applying a negative voltage decreases VTH.

One or more embodiments may apply negative polarization (bias) of a source node versus the body. Such a polarization cannot be increased indefinitely insofar as this is limited by the presence of body-source PN junction which becomes forward-polarized when the source terminal is about 0.7V lower than body terminal (at room temperature).

This may put a limit on the amount the body effect can be applied to decrease of VTH.

For instance, in the case of a circuit supplied with VDD=1V and the input voltage VIN swept from 0 to 1V, monitoring the output voltage VOUT in both cases (without body control and with body control) shows the following.

For a standard amplifier without body control (see FIG. 1, for instance) the output voltage VOUT goes down from a high level to a low level at an input voltage of about 580 mV. This essentially corresponds to the threshold VTH (and the gate-source voltage VGS providing conduction of the drain current set) in the MOSFET MN1. This means that the amplifier is not able to handle input voltages below 580 mV.

If body control is applied (see FIG. 3, for instance) the input voltage range is widened towards lower values. For instance, for VIN at about 350 mV the MOSFET MN1 is still able to sink a defined drain current. This indicates that one or more embodiments facilitate widening the input voltage range of about 230 mV.

It is observed that for high values of VIN (near VDD, for instance, the body voltage or potential Vbody is nearly zero. At input voltage levels around 600 mV the body potential starts to increase and to apply a body effect to the amplifier. At low levels for VIN the body voltage saturates at about 620 mV due to the forward polarization of body-source junction in the MOSFET. In fact, elementary single-MOSFET amplifiers are used in active mode around the voltage VTH. For (much) higher values of VIN, the amplifier output will saturate near zero voltage.

As exemplified in FIG. 4, the same principle can be applied to a differential stage as discussed previously in connection with FIG. 2.

In that respect, it is again recalled that like elements are indicated with like symbols (for instance G, S, D, B) throughout the figures, thus making it unnecessary to repeat (in respect of FIG. 4, for instance) a detailed description of integers already discussed in connection with FIGS. 1 to 3.

As exemplified in FIG. 4, body control circuitry comprising MOSFET MN3 and bias generator IBAux can be associated to the differential pair MN1, MN2. As exemplified in FIG. 4.

As exemplified in FIG. 4, the body control MOSFET MN3 is sensing the input voltage (only) at the non-inverting input IN+ of MN1. This type of sensing may suffice insofar as the amplifier is connected in a loop which is a closed one, so that the steady state voltage on both inputs IN+, IN− is equal.

As exemplified in FIG. 4, the amplifying MOSFETS MN1 and MN2 are loaded at their (mutually connected) body terminals B1, B2 by the current source IBMain. The MOSFET MN3 has its body terminal B3 shorted to its drain terminal D3 and thus to the body terminals B1, B2 of both MN1 and MN2. Here again, the MOSFETs MN1, MN2, on the one hand, and the MOSFET MN3, on the other hand, may be of a same type so that their electrical characteristics are matched, even with different W/L sizing applied.

If the IN+ voltage is sufficiently high for normal operation, the bodies MN1, MN2 and MN3 are tied to GND via the current path (drain D3) of MN3 and the circuit operates without body polarization.

If the voltage at IN+ drops near the threshold VTH of MN3, the drain current of MN3 is not able to sink all the IBAux current and the drain potential of MN3 starts to increase. Also, the body potential (Vbody) of all the three MOSFETs MN1, MN2 and MN3 is increased, thus inducing a body effect which reduces the threshold VTH and facilitates normal operation of the amplifier.

Here again, the body effect has a limit in the forward polarization of the body-source PN junctions in the MOSFETs, with the MOSFET MN3 being of the same type as MN1. Again, good practice may suggest to size MN3 differently from MN1, for instance with W/L of MN1 higher than W/L of MN3. The difference in size will result in a certain difference (delta VGS) in the gate-source voltages of the MOSFETs MN1 and MN3, with the voltage VGS of MN1 being lower. Such a delta voltage will occur at the common tail node (sources of MN1 and MN2), facilitating normal current biasing by the tail generator IBTail.

Operation of a circuit as exemplified in FIG. 4 can be investigated with the differential amplifier connected into unity gain configuration by shorting the output VOUT to the inverting input −IN, so that the output signal VOUT should expectedly follow the input voltage IN+.

In case the body effect is not applied (see FIG. 2, for instance) the amplifier is able to follow an input voltage sweep at +IN (only) from about 500 mV.

In case the body effect is relied upon (see FIG. 4, for instance), the input voltage range is increased insofar as the amplifier is capable of following an input voltage as low as 300 mV. When the input voltage +IN is higher than 700 mV, the body voltage VBody is near ground level GND and no body effect is effectively applied. As the input voltage IN+ decreases, the body node voltage increases until saturation is reached at about 620 mV as a result of forward polarization of body-source PN junction. During the body voltage transition from zero to the saturation level the VTail voltage remains constant at about 70 mV which is compatible with maintaining the tail current IBTail at correct values. This voltage may be obtained thanks to the difference in sizing between MN1 and MN3. The higher the difference between W/L in MN1 and W/L in MN3, the higher the VTail voltage during the transition.

FIG. 5 (where elements like elements already discussed in connection with the previous figures are indicated with like symbols) shows a differential amplifier essentially of a same structure as the differential amplifier exemplified in FIG. 4, save that in FIG. 5 the body control circuitry is made sensitive to the voltage at both inputs IN+, IN−. As exemplified in FIG. 5, this result is achieved by "splitting" the MOSFET MN3 into two MOSFETS MN3' and MN3" which have their gates G3', G3" coupled to IN+ and IN−, respectively, and the (source-drain) current paths therethrough (namely S3', D3'; S3", D3") cascaded—that is, essentially arranged in series—between the body terminals of MN1, MN2 and ground GND. The body terminals B3', B3" of MN3' and MN3" are connected together and coupled to the body terminals of MN1, MN2 (and the drain D3' of MN3').

In a circuit as exemplified in FIG. 5, the circuitry which controls the body of the MOSFETs MN1, MN2 facilitates regulation of body voltage as a function of the one of the inputs IN+, IN− having the lower level. With this proviso, the principle of operation of the body control mechanism is the same as discussed previously in connection with FIG. 4.

A circuit as exemplified in FIG. 5 can be used, for instance, in those applications where the two inputs of the differential arrangement are not at a same level. A comparator circuit may be exemplary of such an application.

FIG. 6 is exemplary of the possibility of applying the same principles discussed in the foregoing also to other types of circuits such as a current mirror circuit.

Once again, elements like elements already discussed in connection with the previous figures are indicated with like symbols, and a corresponding description will not be repeated here for brevity.

In embodiments as exemplified in FIG. 6, the body control action can be embedded in a simple MOSFET current mirror by having a body control MOSFET (again indicated as MN3) sensing the voltage drop on the input MOSFET MN1 of the current mirror comprising, in a conventional manner, two MOSFETS MN1 (draining current I1) and MN2' (draining current I2).

In those circumstances where such a voltage drop at MN1 is found to be insufficient to facilitate correct current mirroring (which, for instance, may be due to VDD being insufficient, that is undesirably low) the possibility again exists of resorting to the body effect in order to increase the body voltage (Vbody) and inducing a reduction in the threshold voltage VTH.

A circuit as exemplified herein may comprise:
a MOSFET (for instance, MN1) having source (for instance, S1) and drain (for instance, D1) terminals with a (source-drain) current conduction path therebetween, a gate terminal (for instance, G1) configured to receive an input signal (for instance, VIN) to facilitate current conduction (for instance, IBMain) in said current conduction path as a result of the gate-to-source voltage reaching a threshold (for instance, VTH), as well as a body terminal (for instance, B1),
body voltage control circuitry (for instance, MN3; MN3', MN3") sensitive to the voltage at the gate terminal of said MOSFET, the body voltage control circuitry coupled to the body terminal of said MOSFET and configured to increase the body voltage of said MOSFET as a result of a reduction in the voltage at the gate terminal of said MOSFET, wherein said threshold is reduced.

In a circuit as exemplified herein (see, for instance, FIG. 3) the body voltage control circuitry may comprise at least one body voltage control MOSFET (for instance, MN3) having:
a respective gate terminal (for instance, G3) coupled to the gate terminal of said MOSFET, wherein said respective gate terminal is sensitive to the voltage at the gate terminal of said MOSFET, and a respective source-drain current path (for instance, S3, D3) through the at least one body voltage control MOSFET, said respective source-drain current path coupled to the body terminal of said MOSFET.

In a circuit as exemplified herein (see again, for instance, FIG. 3) the at least one body voltage control MOSFET may:
be coupled at the drain terminal of the respective source-drain current path to the body terminal of said MOSFET, and/or
have a respective body terminal coupled to the body terminal of said MOSFET, and/or
be coupled to a current source (for instance, IBAux) to source a bias current to flow through said respective source-drain current path.

In a circuit as exemplified herein the at least one body voltage control MOSFET may be of a same type, n-channel or p-channel, of said MOSFET.

A circuit as exemplified herein (see, for instance, the differential arrangement of FIG. 4) may comprise:
a further MOSFET (for instance, MN2) having further source (for instance, S2) and drain (for instance, D2) terminals with a further current conduction path therebetween, a further gate terminal (for instance, G2) as well as a further body terminal (for instance, B2), the further MOSFET (MN2) coupled with said MOSFET in a differential MOSFET pair
wherein:
the gate terminal of said MOSFET and the further gate terminal of said further MOSFET are configured to receive a differential input signal (for instance, IN+, IN−) therebetween to facilitate current conduction (for instance, IBTail) in said current conduction path and said further current conduction path as a result of the gate-to-source voltages in said MOSFET and said further MOSFET reaching a threshold (VTH),
said body voltage control circuitry is sensitive to the voltage (for instance, IN+) at the gate terminal of said MOSFET and is coupled to the body terminal of said MOSFET and to the further body terminal of said further MOSFET and configured to increase the body voltage of said MOSFET and said further MOSFET as a result of a reduction in the voltage at the gate terminal of said MOSFET wherein said threshold is reduced.

In a circuit as exemplified herein (see, for instance, FIG. 5) said body voltage control circuitry (for instance, MN3', MN3") may by sensitive to the voltage (for instance, IN+) at the gate terminal of said MOSFET as well as to the voltage (for instance, IN−) at the further gate terminal of said further MOSFET, wherein said threshold is reduced as a result of a reduction in either one of the voltage at the gate terminal of said MOSFET or the voltage at the further gate terminal of said further MOSFET.

In a circuit as exemplified herein (see again for instance FIG. 5), the body voltage control circuitry may comprise:
a first body voltage control MOSFET (for instance, MN3') having a first respective gate terminal (for instance, G3') coupled to the gate terminal of said MOSFET, wherein said first respective gate terminal is sensitive to the voltage at the gate terminal of said MOSFET, and
a second body voltage control MOSFET (for instance, MN3") having a second respective gate terminal (for instance, G3") coupled to the further gate terminal of said further MOSFET, wherein said second respective gate terminal is sensitive to the voltage at the gate terminal of said further MOSFET,
wherein the first body voltage control MOSFET and the second body voltage control MOSFET have respective first (for instance, B3') and second (for instance, B3") body terminals jointly coupled to the body terminal of said MOSFET and to the further body terminal of said further MOSFET (MN2).

In a circuit as exemplified herein (see again, for instance, FIG. 5) the first body voltage control MOSFET and the second body voltage control MOSFET may have source-drain current paths (for instance, S3', D3'; S3", D3") arranged one cascaded to the other in a current path coupling to ground the body terminal of said MOSFET and the further body terminal of said further MOSFET.

In a circuit as exemplified herein the first body voltage control MOSFET and the second body voltage control MOSFET may be of a same type, n-channel or p-channel, of said MOSFET.

A circuit as exemplified herein (see, for instance, the current-mirror arrangement of FIG. 6) may comprise:
a second MOSFET (for instance, MN2') having second source (for instance, S2') and drain (for instance, D2') terminals with a second current conduction path (for instance, S2', D2', I2) therebetween, a second gate terminal (for instance, G2') as well as a second body terminal (for instance, B2'),
wherein:
the gate terminal of said MOSFET and the second gate terminal of said second MOSFET are mutually coupled to provide a current mirror arrangement of said MOSFET and said second MOSFET,
said body voltage control circuitry is sensitive to the voltage at the gate terminal of said MOSFET and the second gate terminal of said second MOSFET,
said body voltage control circuitry is coupled to the body terminal of said MOSFET and to the second body terminal of said second MOSFET and configured to increase the body voltage of said MOSFET and said second MOSFET as a result of a reduction in the voltage at the gate terminal of said MOSFET wherein said threshold is reduced.

In a method of operating a MOSFET as exemplified herein, having source and drain terminals with a current conduction path therebetween, a gate terminal configured to receive an input signal to facilitate current conduction in said current conduction path as a result of the gate-to-source voltage reaching a threshold, as well as a body terminal,
the method may comprise:
sensing the voltage at the gate terminal of said MOSFET,
increasing the body voltage of said MOSFET as a function of a decrease in the voltage sensed at the gate terminal of said MOSFET, wherein said threshold is reduced as a result of the reduction in the voltage at the gate terminal of said MOSFET.

Without prejudice to the underlying principles, the details and embodiments may vary, even significantly, with respect to what has been described by way of example only, without departing from the extent of protection.

For instance, the exemplary embodiments presented here are not exhaustive. Additional embodiments can be identified by skilled person: just to mention one (non-limiting) case in point, one may consider "complementary" embodiments where n-channel MOSFETs are replaced by p-channel MOSFETs and vice versa, that is, one or more embodiments are applicable to complementary solutions replacing n-channel MOSFETS with p-channel MOSFETs and vice versa.

Also, it will be appreciated that the body effect pursued in the embodiments has been explained in connection with the threshold voltage VTH for simplicity, while the gate-source voltage VGS of the MOSFET, which facilitates conduction of a certain drain current, may be considered.

The extent of protection is determined by the annexed claims.

The claims are an integral part of the technical teaching provided herein in respect of the embodiments.

The invention claimed is:

1. A circuit, comprising:
   a first MOSFET having a current conduction path between a first source terminal and a first drain terminal, and further including a first gate terminal and a first body terminal;
   a second MOSFET having a current conduction path between a second source terminal and a second drain terminal, and further including a second gate terminal and a second body terminal;
   wherein the first and second MOSFETs are connected in a current mirror arrangement;
   a third MOSFET having a current conduction path between a third source terminal and a third drain terminal, and further including a third gate terminal;
   wherein the third gate terminal is electrically connected to the first drain terminal and the first and second gate terminals; and
   wherein the third drain terminal is electrically connected to the first and second body terminals.

2. The circuit of claim 1, wherein the third drain terminal is electrically connected to the third body terminal.

3. The circuit of claim 1, further comprising a first current source configured to source a first current to the current conduction path of the first MOSFET.

4. The circuit of claim 3, further comprising a second current source configured to source a second current to the current conduction path of the third MOSFET.

5. The circuit of claim 1, further comprising an auxiliary current source configured to source an auxiliary current to the current conduction path of the third MOSFET.

6. The circuit of claim 1, wherein the third MOSFET functions as a body voltage control circuit that responds to change in voltage at the first drain terminal of the first MOSFET by changing a body voltage at the first body terminal of the first MOSFET in order to adjust a threshold voltage of the first MOSFET.

7. The circuit of claim 6, wherein the adjustment of the threshold voltage is a reduction of the threshold voltage.

8. A method for performing body voltage control on a circuit that includes at least a first MOSFET having a current conduction path between a first source terminal and a first drain terminal, a first gate terminal configured to receive a first input signal and a first body terminal, and a second MOSFET having a current conduction path between a second source terminal and a second drain terminal, a second gate terminal configured to receive a second input signal and a second body terminal, the method comprising:
   sensing a voltage at the first gate terminal of the first MOSFET; and
   in response to a decrease in the sensed voltage at the first gate terminal, increasing a body voltage applied to the first and second body terminals in order to reduce a threshold voltage of at least the first MOSFET;
   wherein said first and second MOSFETs are configured in a current mirror relationship.

* * * * *